(12) United States Patent
Fang et al.

(10) Patent No.: US 8,742,496 B2
(45) Date of Patent: Jun. 3, 2014

(54) SONOS MEMORY CELLS HAVING NON-UNIFORM TUNNEL OXIDE AND METHODS FOR FABRICATING SAME

(71) Applicant: Spansion LLC, Sunnyvale, CA (US)

(72) Inventors: Shenqing Fang, Fremont, CA (US); Gang Xue, Sunnyvale, CA (US); Wenmei Li, San Jose, CA (US); Inkuk Kang, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 41 days.

(21) Appl. No.: 13/919,655

(22) Filed: Jun. 17, 2013

(65) Prior Publication Data

US 2013/0277732 A1    Oct. 24, 2013

Related U.S. Application Data

(62) Division of application No. 12/432,441, filed on Apr. 29, 2009, now Pat. No. 8,487,373.

(51) Int. Cl.
*H01L 21/331*    (2006.01)

(52) U.S. Cl.
USPC ............ 257/333; 257/324; 257/325; 438/287

(58) Field of Classification Search
USPC ......... 257/333, 200, 302, 315, 316, 329, 330, 257/390; 438/128, 259, 276, 287
See application file for complete search history.

(56) References Cited

U.S. PATENT DOCUMENTS

| 7,038,267 | B2 | 5/2006 | Change et al. |
| 7,745,287 | B2 | 6/2010 | Choi |
| 2005/0196923 | A1 | 9/2005 | Deppe et al. |

*Primary Examiner* — Kimberly Rizkallah
*Assistant Examiner* — Errol Fernandes (57) ABSTRACT

Methods for forming a memory cell are disclosed. A method includes forming a source-drain structure in a semiconductor substrate where the source-drain structure includes a rounded top surface and sidewall surfaces. An oxide layer is formed on the top and sidewall surfaces of the source-drain structure. The thickness of the portion of the oxide layer that is formed on the top surface of the source-drain structure is greater than the thickness of the portion of the oxide layer that is formed on the sidewall surfaces of the source-drain structure.

6 Claims, 14 Drawing Sheets

SONOS MEMORY CELLS HAVING NON-UNIFORM TUNNEL OXIDE AND METHODS FOR FABRICATING SAME

CROSS-REFERENCE TO RELATED APPLICATIONS

This application is a divisional of U.S. patent application Ser. No. 12/432,441, filed on Apr. 29, 2009, entitled "SONOS Memory Cells Having Non-Uniform Tunnel Oxide and Methods for Fabricating Same," which is hereby incorporated herein by reference in their entirety.

FIELD OF THE INVENTION

The present invention relates to the fabrication of memory cells.

BACKGROUND

Consumer electronic products such as televisions, digital cameras, cellular telephones, media content players, etc., help to satisfy consumer demand for basic communications and entertainment services. Data storage components play an important role in the operation of these devices. Data storage devices include RAM, ROM, flash memory products, etc.

An important feature of data storage devices is memory cell density. There are many approaches to increasing the memory cell density of memory arrays. One approach involves reducing the channel length between the source and the drain of transistors associated with memory cells in a memory array. This allows the size of each memory cell to be reduced which in turn facilitates the provision of denser memory arrays. Another approach to increasing memory cell density is embodied in a commercially available flash memory product called MirrorBit™ Technology from Spansion, located in Sunnyvale, Calif.

In flash memory arrays that use MirrorBit technology, the use of MirrorBit memory cells effectively doubles their intrinsic density by storing two physically distinct bits on opposite sides of the memory cells. Each bit that is stored within a cell serves as a binary unit of data (either a logic one or zero) that is mapped directly to the memory array.

An exemplary MirrorBit™ memory device includes a semiconductor substrate with spaced apart source and a drain regions (both typically having N-type conductivity) formed in a substrate. An oxide-nitride-oxide (ONO) layered stack is formed on the top surface of the substrate between the source and drain regions. A gate electrode, which typically comprises an N or N+ polysilicon layer, is formed over the ONO stack to provide a silicon-oxide-nitride-oxide (SONOS) structure. The ONO stack includes a first or bottom dielectric layer (often referred to as a bottom tunnel oxide), a charge storing nitride layer, and a second or top dielectric layer of oxide.

Some challenges associated with SONOS devices are related to structural and functional features of the device. For example, it can be difficult to reduce the size or pitch of the cell because the storage element of the above-mentioned flash memory cell can be planar (the oxide, nitride and oxide layers are all horizontal layers formed one on top of the other on the silicon substrate). Moreover, during the erasure of a SONOS memory cell such as by hot hole injection, because hot holes bombard the interface between the substrate and the bottom tunnel oxide, the interface as well as the bottom tunnel oxide can be damaged causing undesirable interface states and degraded reliability over program/erase cycling.

Some conventional SONOS devices use shallow trench isolation (STI) structures that define the device active area. Conventional fabrication methodologies that form such structures can yield results that can affect the operation of the fabricated SONOS devices. Problematic features of devices fabricated from conventional methodologies include localized electron injection at the corners of the active area STI structures when these structures feature uniform bottom oxide coverage. This localized electron injection can degrade reliability. In particular, it should be appreciated that localized electron injection at corners between the top surface of an STI structure and its sidewalls can contribute to early breakdown.

Figure 1:
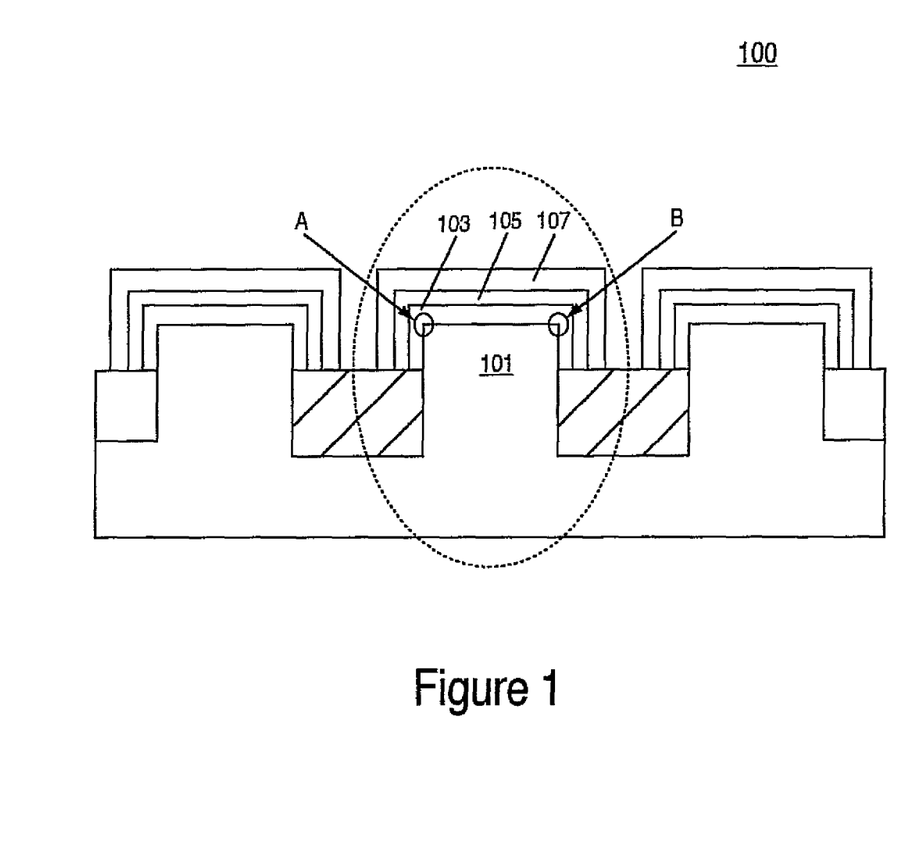
FIG. 1 is a cross section of a conventional oxide-nitride-oxide (ONO) memory cell structure.

FIG. 1 shows a conventional ONO memory structure 100. Memory structure 100 includes semiconductor structure 101, bottom oxide 103, nitride layer 105 and top oxide 107. It should be appreciated that as devices such as ONO memory structure 100 are made smaller, localized electron injection at corners (see A and B in FIG. 1) of semiconductor structure 101 becomes more severe. As discussed above, such localized electron injection can contribute to breakdown of bottom oxide 103 at these points. It should be appreciated that a breakdown of bottom oxide 103 can cause a loss of charge for the charge storage cell structure. As a result, the reliability of the device suffers as programmed data can be lost.

As can be seen from the above discussion, conventional approaches to fabricating memory cells can provide poor results. These approaches can yield devices with features that negatively affect device function and degrade reliability.

SUMMARY OF THE INVENTION

Methods for forming a memory cell are disclosed. A method includes forming a source-drain structure in a semiconductor substrate where the source-drain structure includes a rounded top surface and sidewall surfaces. An oxide layer is formed on the top and sidewall surfaces of the source-drain structure. The thickness of the portion of the oxide layer that is formed on the top surface of the source-drain structure is greater than the thickness of the portion of the oxide layer that is formed on the sidewall surfaces of the source-drain structure.

BRIEF DESCRIPTION OF THE DRAWINGS

The invention, together with further advantages thereof, may best be understood by reference to the following description taken in conjunction with the accompanying drawings in which.

It should be noted that like reference numbers refer to like elements in the figures.

DETAILED DESCRIPTION OF THE INVENTION

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

SONOS Memory Cells Having Non-Uniform Tunnel Oxide According to One Embodiment

Figure 2A:
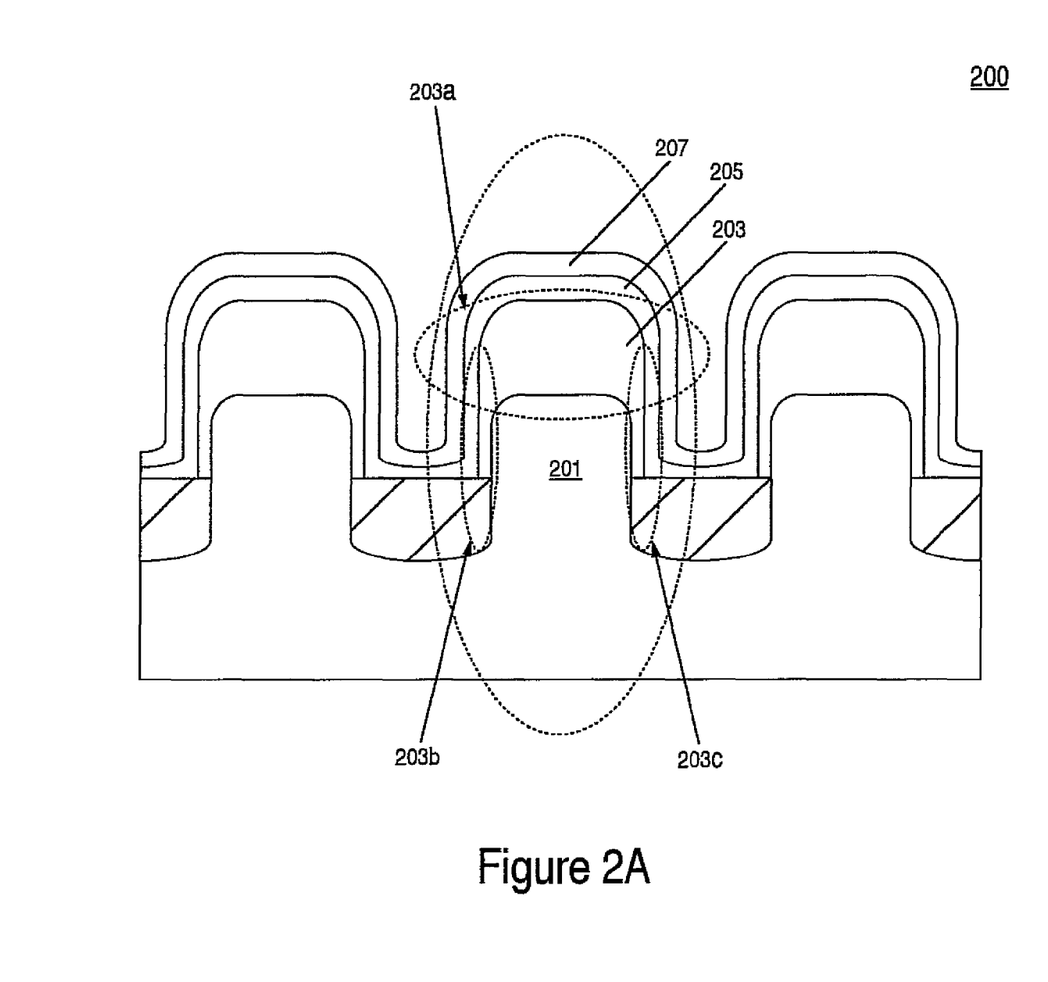
FIG. 2A shows a cross section of a plurality of memory cell components that include semiconductor source-drain structures according to one embodiment.

FIG. 2A shows a cross section of a plurality of memory cell components 200 of a three-dimensional silicon-oxide-nitride-oxide-silicon (SONOS) memory cell array according to one embodiment. In one embodiment, the memory cells include semiconductor source-drain structures that have rounded top surfaces and sidewalls upon which a bottom oxide is formed. In one embodiment, the bottom oxide is formed thicker along the top surfaces of the source-drain structures than along the sidewalls of the source-drain structures. In one embodiment, this bottom oxide thickness profile inhibits the type of oxide breakdown that can occur in memory cells that feature a uniform bottom oxide structure. It should be appreciated that the non-conformal bottom oxide forming processes described herein provide memory cell structures that exhibit a more uniform electron injection, as compared to conventional structures, and that are resistant to breakdown (e.g., are highly reliable). In the FIG. 2A embodiment memory cell components 200 include source-drain structure 201, nitride charge storage layer 205, bottom oxide layer 203 and top oxide layer 207 (see encircled elements).

Referring to FIG. 2A, in one embodiment, source-drain structure 201 is formed from a semiconductor material (e.g., silicon) and is the initial component of the memory cell structure that is formed in the memory cell fabrication process. Oxide layer 203 is formed over source-drain structure 201 and forms an interface therewith. As shown in FIG. 2A, the portion 203A of oxide layer 203 that is formed on the top surface of source-drain structure 201 is thicker than the portions, 203B and 203C, of oxide layer 203 that are formed on the sidewalls of source-drain structure 201. Nitride charge storage layer 205 is formed over bottom oxide layer 203 and constitutes the charge storage element of memory cell components 200. Top oxide layer 207 is formed over nitride charge storage layer 205 and forms an interface therewith. In one embodiment, a polycrystalline layer (not shown) can be formed over top oxide layer 207 to complete the silicon-oxide-nitride-oxide-silicon (SONOS) three dimensional memory cell structure.

In one embodiment, scaling is facilitated because of the elimination or reduction of the incidence of breakdown at the top surface corners and edges of source-drain structure 201 that can be aggravated as the size of devices are reduced. Moreover, a more uniform flow of current based on a more uniform injection of electrons (as opposed to the localized injection of conventional devices) is facilitated because of the optimized charge distribution in nitride charge storage layer 205 facilitated by exemplary embodiments.

Figure 2B:
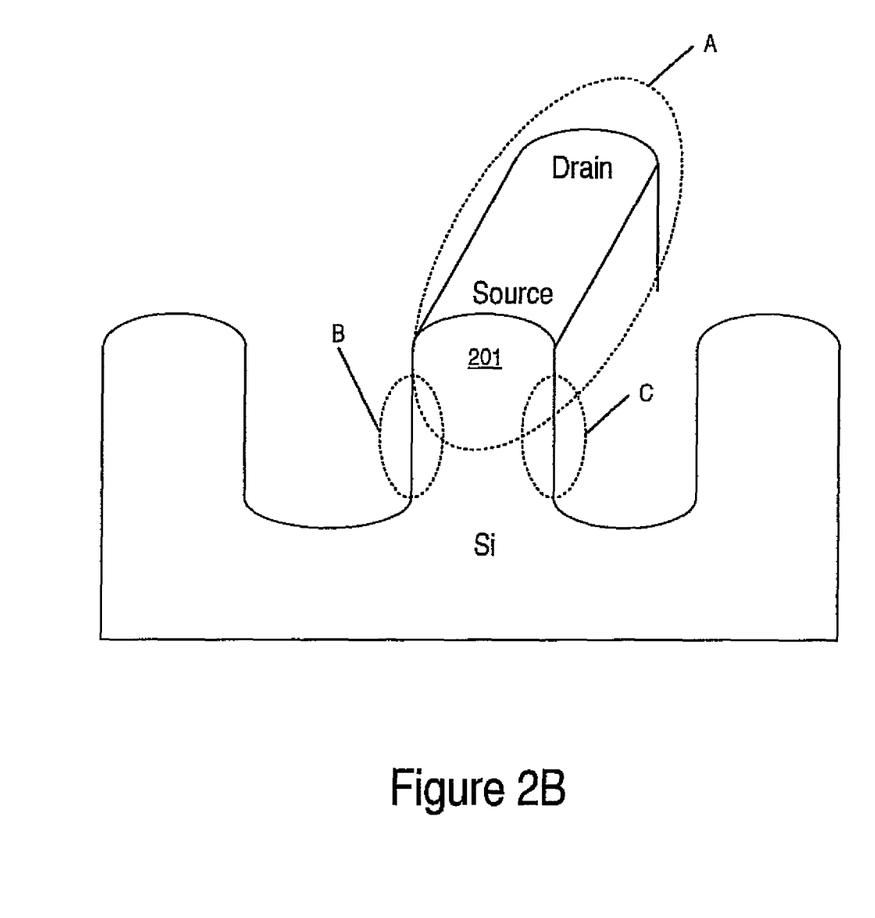
FIG. 2B shows a three-dimensional depiction of a source-drain structure of a memory cell according to one embodiment.

FIG. 2B shows a perspective view of the source-drain components of a three-dimensional SONOS memory cell structure, such as memory cell components 200 of FIG. 2A, including its source and drain regions (see identified exemplary source and drain regions in FIG. 2B). Referring to FIG. 2B encircled elements show respectively the top surface A, left sidewall B and right sidewall C of source-drain structure 201. In one embodiment, as shown in FIG. 2A, a bottom oxide layer (e.g., 203 in FIG. 2A) can be formed to be more thick on the top surface A of source-drain structure 201 than on the sidewalls B and C of source-drain structure 201. In one embodiment, the oxide on the top surface A of source-drain structure 201 can be formed to be at least 1.5 times as thick as the oxide formed on the sidewalls B and C of source-drain structure 201. In other embodiments, the oxide on the top surface A of source-drain structure 201 can be formed to be more or less than at least 1.5 times as thick as the oxide formed on the sidewalls B and C of source-drain structure 201.

Figure 3:
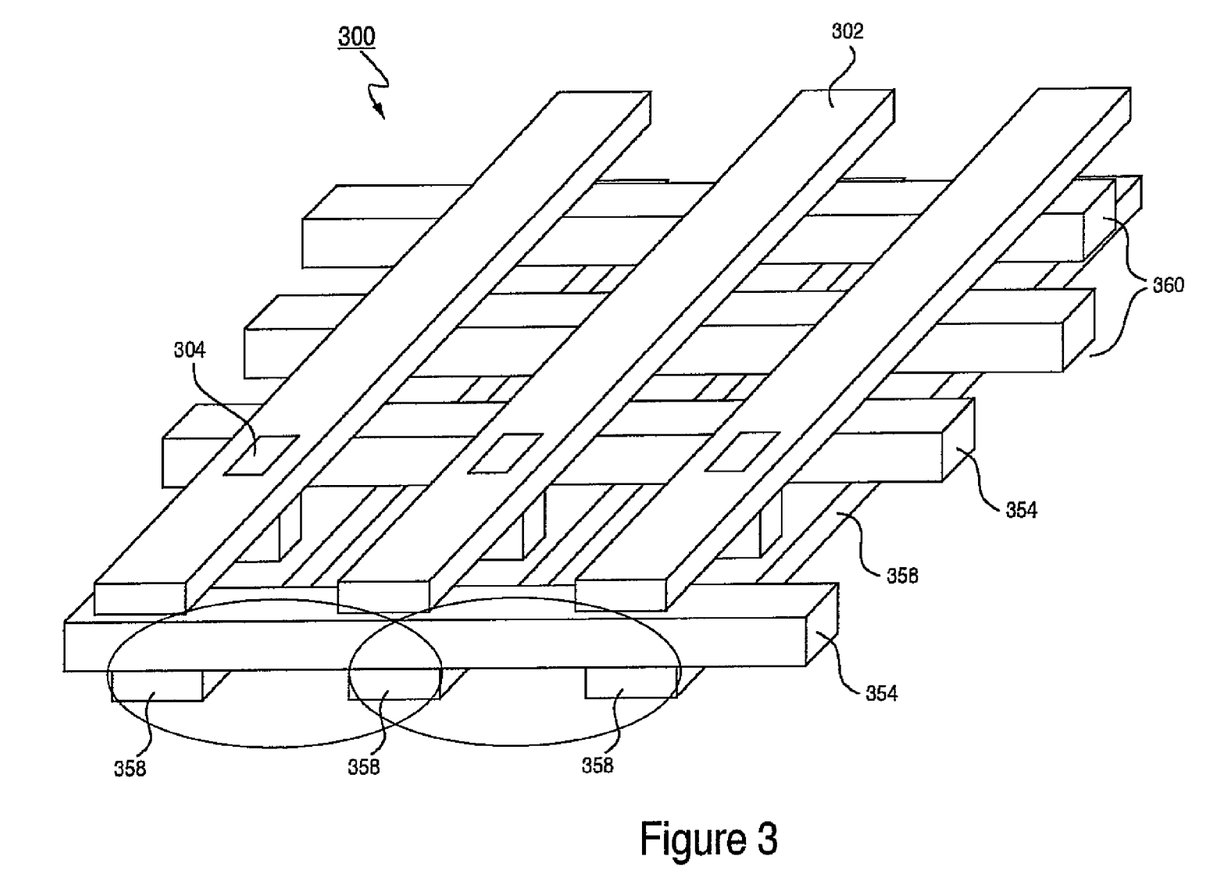
FIG. 3 shows an array architecture that employs memory cells such as described with reference to FIG. 2A according to the one embodiment of the present invention.

FIG. 3 shows an exemplary array architecture 300 that employs memory cells such as are described with reference to FIG. 2A. Array 300 includes a plurality of word lines 360 that run in one direction and a plurality of overlying metal interconnects 302 that run in a perpendicular direction. The metal interconnects 302 deliver a voltage to underlying source/drain regions 358 through metal interconnects 304. FIG. 3 also shows select gates 354.

Figure 4A:
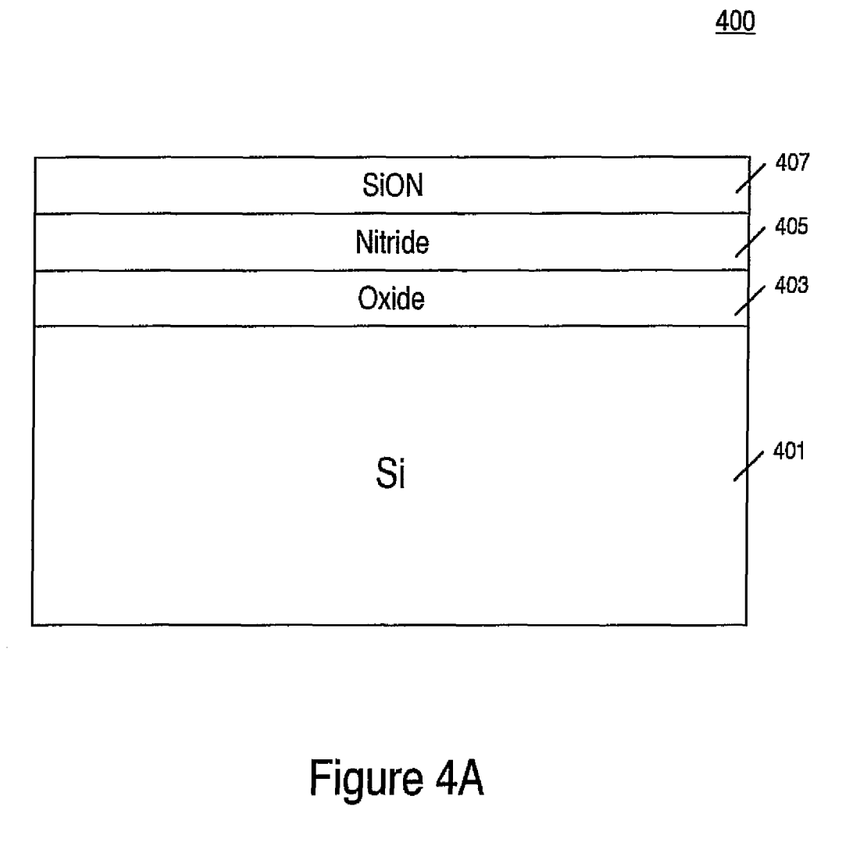
FIG. 4A shows a resultant cross sectional view subsequent to one or more operations in a process for forming a memory cell according to one embodiment of the present invention.

Process Flow for Fabricating SONOS Memory Cells Having Non-Uniform Tunnel Oxide According to One Embodiment FIGS. 4A-4P show a series of cross sections illustrating the process flow involved in forming memory cells having source-drain structures with non-uniform tunnel oxide with greater topside thickness than sidewall thickness according to one embodiment of the invention is shown.

As shown in FIG. 4A, in initial operations a pad oxide layer 403 (which forms a part of a thick bottom oxide layer on the source-drain region of the device under fabrication), nitride layer 405 and composite BARC layer 407 are formed on a silicon substrate wafer 401.

Figure 4B:
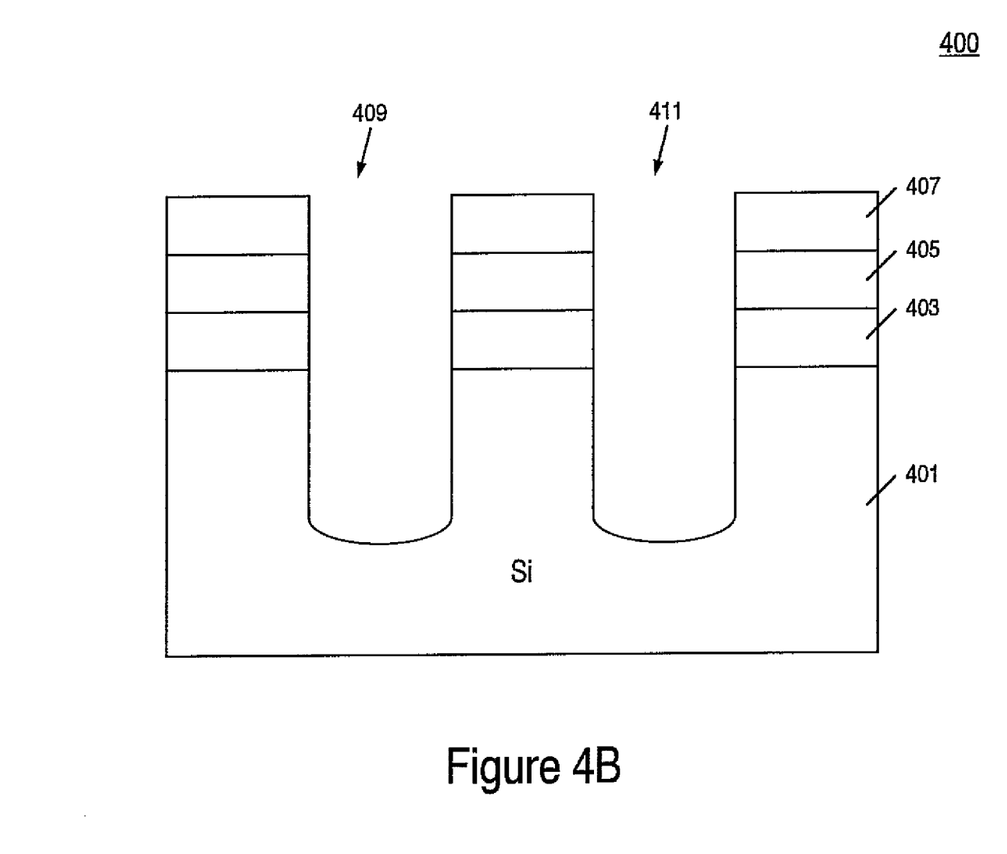
FIG. 4B shows a resultant cross sectional view subsequent to one or more operations in a process for forming a memory cell according to one embodiment of the present invention.

As shown in FIG. 4B, subsequent to one or more operations that result in the cross section shown in FIG. 4A, an SD (source-drain) mask is applied and an STI etch is performed that forms trenches 409 and 411.

As shown FIG. 4C, subsequent to one or more operations that result in the cross section shown in FIG. 4B, a liner oxide 413 is formed in trenches 409 and 411 formed by the STI etch discussed with reference to FIG. 4B.

Figure 4C:
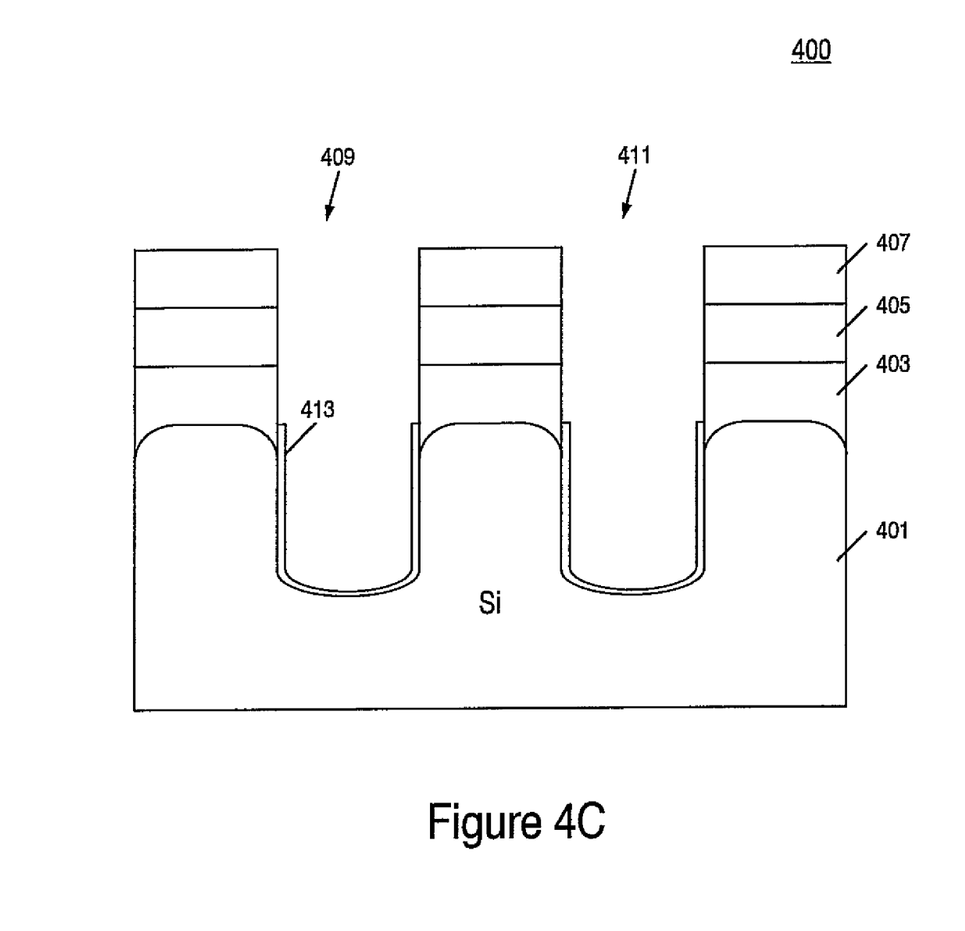
FIG. 4C shows a resultant cross sectional view subsequent to one or more operations in a process for forming a memory cell according to one embodiment of the present invention.
Figure 4D:
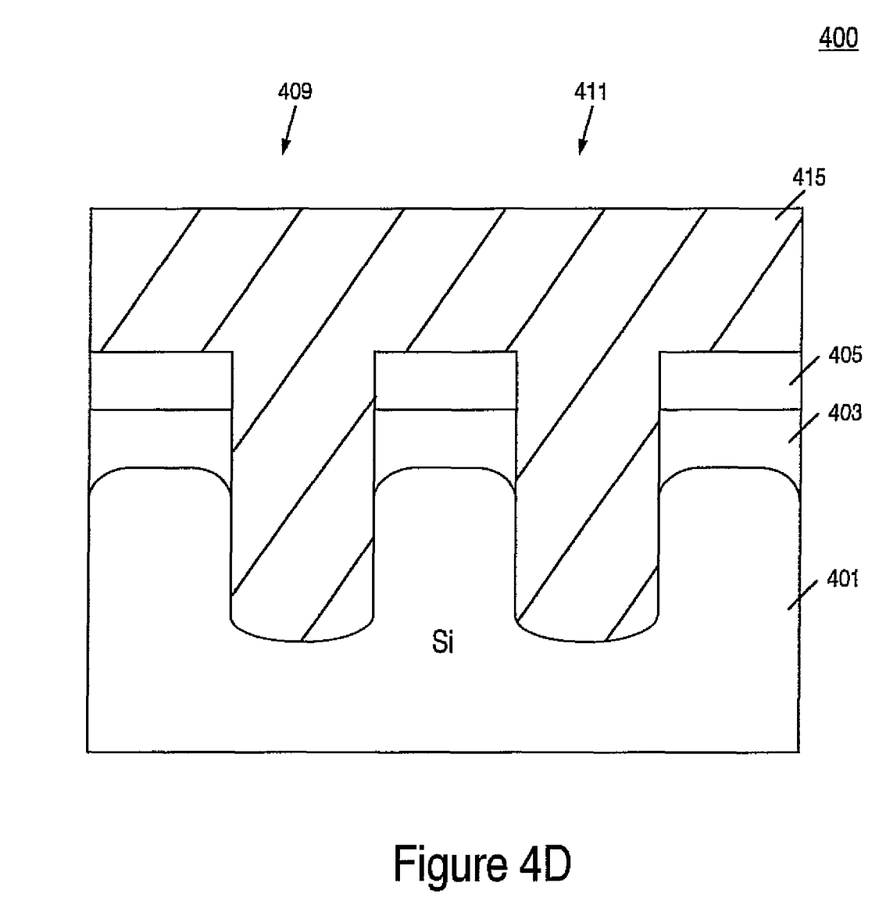
FIG. 4D shows a resultant cross sectional view subsequent to one or more operations in a process for forming a memory cell according to one embodiment of the present invention.

As shown in FIG. 4D, subsequent to the execution of one or more operations that result in the cross section shown in FIG. 4C, an STI oxide fill 415 is formed. In one embodiment the STI oxide fill 415 fills trenches 409 and 411 and covers the surface of the semiconductor structure 400 under fabrication (see FIG. 4D).

Figure 4E:
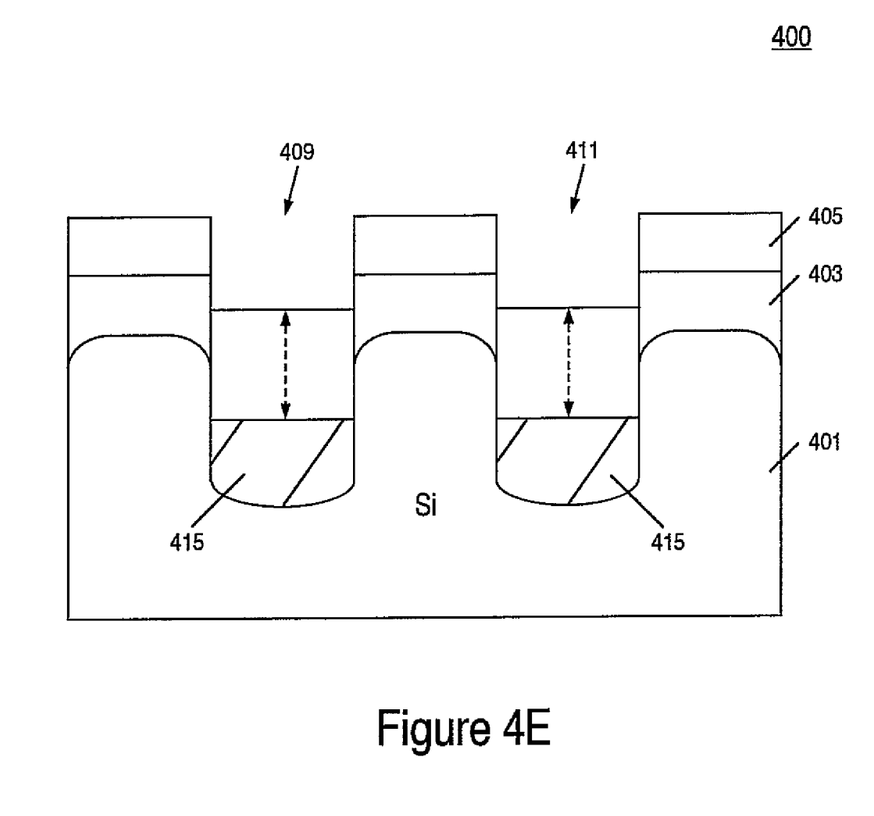
FIG. 4E shows a resultant cross sectional view subsequent to one or more operations in a process for forming a memory cell according to one embodiment of the present invention.

As shown in FIG. 4E, subsequent to the execution of one or more operations that result in the cross section shown in FIG. 4D, an STI CMP (chemical mechanical polishing) operation is performed. In one embodiment, the STI CMP operation removes the portion of oxide fill 415 that covers the surface of structure 400 in addition to nitride layer 405. In other embodiments, alternate methods of removing the aforementioned portion of oxide fill 415 can be used. Thereafter, as shown in FIG. 4E, a first STI oxide recess is performed. Referring to FIG. 4E, the recessing of the oxide in trenches 409 and 411 is illustrated by the arrows and dashed lines. In one embodiment, a dry etch can be used to remove a portion of the STI oxide. In other embodiments, a portion of the STI oxide can be removed by other techniques.

Figure 4F:
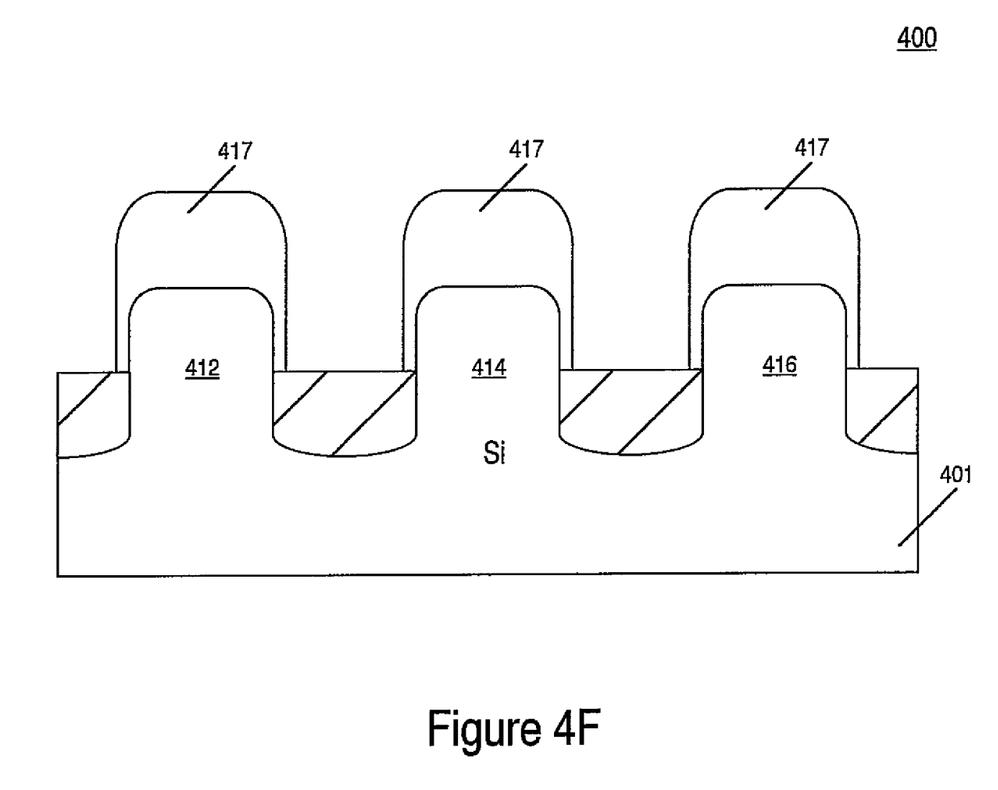
FIG. 4F shows a resultant cross sectional view subsequent to one or more operations in a process for forming a memory cell according to one embodiment of the present invention.

After removal of source-drain nitride, as shown in FIG. 4F, subsequent to the execution of one or more operations that result in the cross section shown in FIG. 4E, an oxide layer 417 is formed above the oxide that is formed on the top surfaces of source-drain structures 412, 414 and 416 and adjacent the bare sidewalls of source-drain structures 412, 414 and 416. This operation results in a bottom or tunnel oxide (composed of the two layers of oxide) that is thicker along the top of source-drain structures 412, 414 and 416 than it is along the sidewalls of source-drain structures 412, 414 and 416.

Figure 4G:
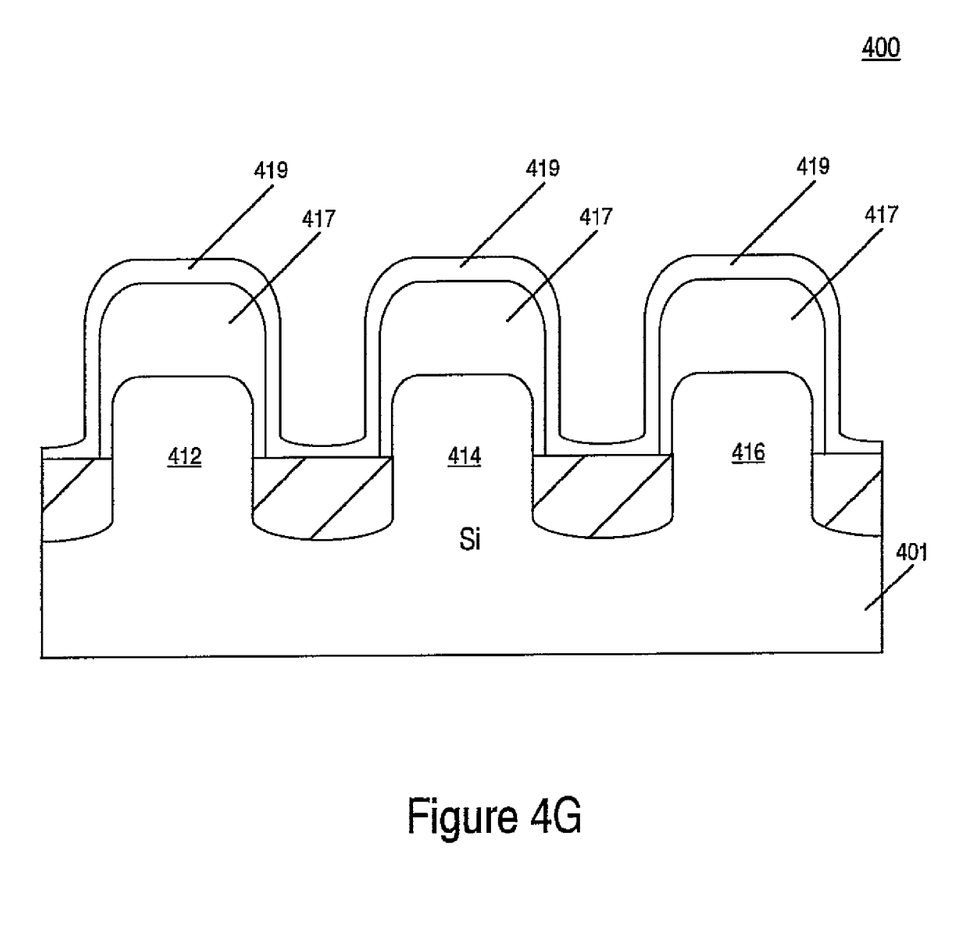
FIG. 4G shows a resultant cross sectional view subsequent to one or more operations in a process for forming a memory cell according to one embodiment of the present invention.

As shown in FIG. 4G, subsequent to the execution of one or more operations that result in the cross section shown in FIG. 4F, an ONO nitride trapping layer 419 is formed over bottom oxide 417. In one embodiment, nitride trapping layer 419 forms the charge storing element of the completed memory cell structure. In an alternate embodiment, the nitride charge trapping layers 419 of the memory cells of a plurality of memory cells being fabricated can be separated as disclosed in commonly assigned U.S. patent application Ser. No. 11/653,649, filed Jan. 12, 2007. Moreover, in one embodiment, nitride trapping layer 419 can include Si rich nitride.

Figure 4H:
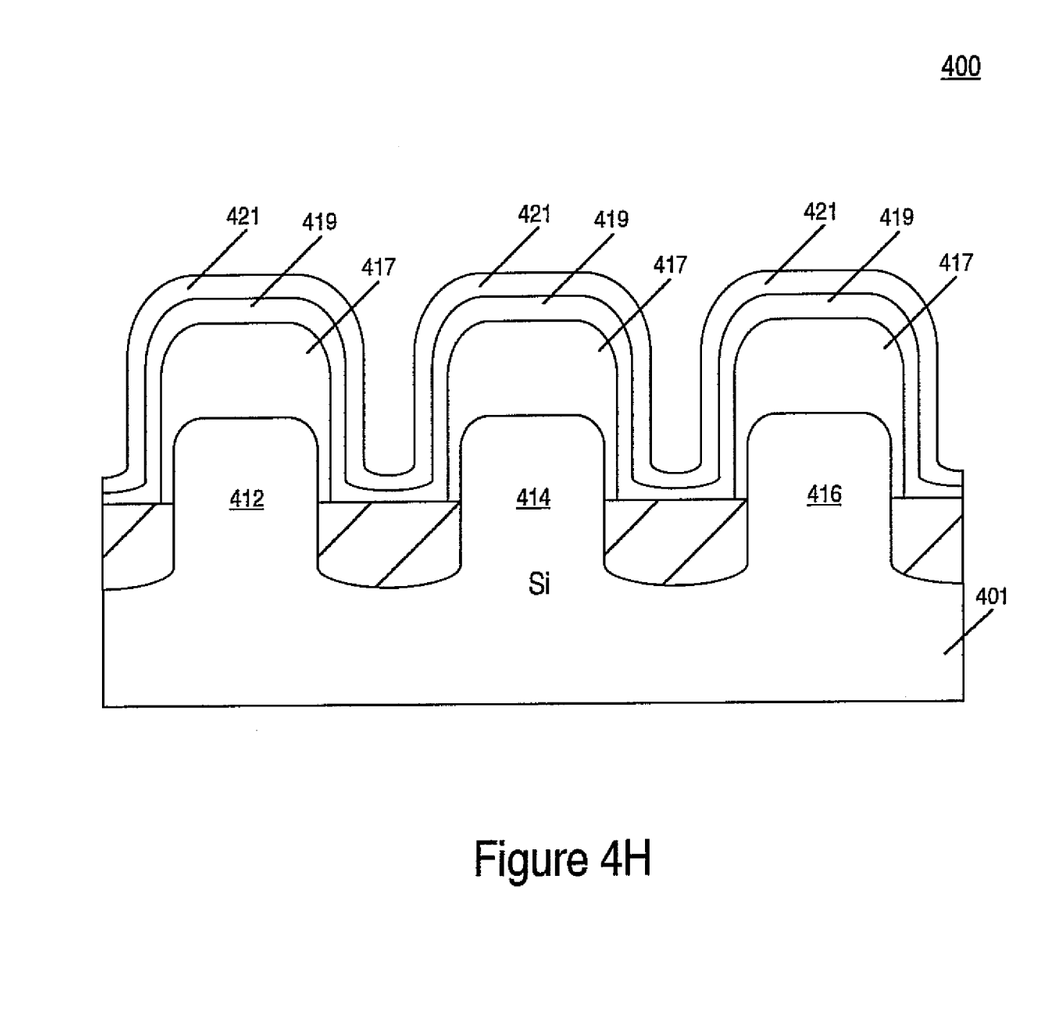
FIG. 4H shows a resultant cross sectional view subsequent to one or more operations in a process for forming a memory cell according to one embodiment of the present invention.

As shown in FIG. 4H, subsequent to the execution of one or more operations that result in the cross section shown in FIG. 4G, an ONO top oxide layer 421 is formed over the ONO nitride trapping layer 419.

Figure 4I:
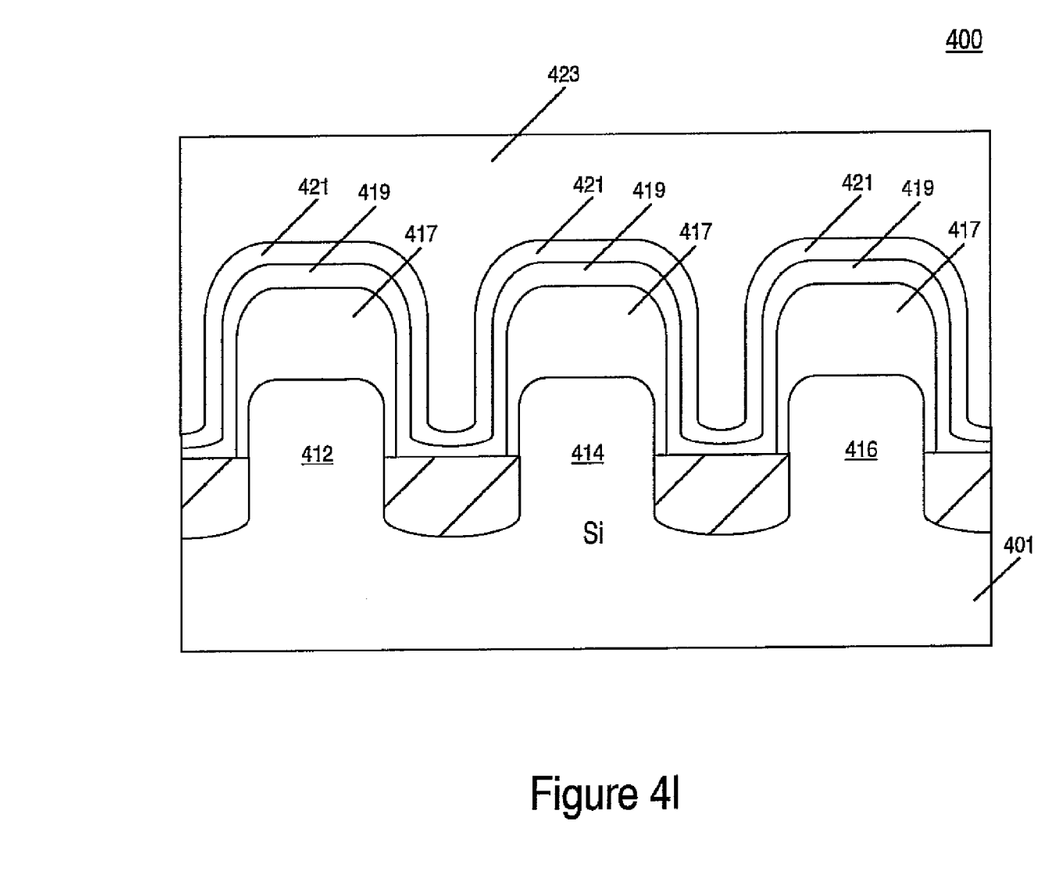
FIG. 4I shows a resultant cross sectional view subsequent to one or more operations in a process for forming a memory cell according to one embodiment of the present invention.

As shown in FIG. 4I, subsequent to the execution of one or more operations that result in the cross section shown in FIG. 4H, a polycrystalline layer 423 is formed over the ONO top oxide layer 421.

Exemplary Advantages
Elimination of Localized Electron Injection

In exemplary embodiments, a charge storage cell structure that features a source-drain structure (201 in FIG. 2A) with a non-conformal oxide film deposited thereon is provided. The non-conformal oxide film is thickest on the top surface of the core source-drain region and features pinch off of the oxide film at the top of the gap in the shallow trench isolation (STI) region. This bottom oxide profile results in more uniform electron injection. It should be appreciated, that even though an electric field may be uniformly applied to the aforementioned source-drain structure during normal operation of the transistor, the electric field that results can be concentrated or more intense at corners and edges of the source-drain structure, which can cause a more localized injection of electrons at such points. As a result, the likelihood of breakdown at such points is greater. Breakdown can cause a loss of charge from the charge storage cell structure. As a result, programmed data stored therein can be lost.

In exemplary embodiments, as discussed above with reference to FIGS. 2A and 2B, forming the bottom oxide to be thicker along the top surface of the source-drain structure than along its sidewalls as disclosed herein eliminates the aforementioned localized electron injection at corners of the source-drain structure that is common in conventional devices and that promotes breakdown. As a result, device reliability is improved.

Resistance to Breakdown

In one embodiment, an ONO memory cell structure that is resistant to the breakdown of its bottom oxide at the top surface corners of an associated source-drain structure is provided. Because breakdown of the bottom oxide at the top surface corners of the associated source-drain structure can be caused by the increased intensity and concentration of an applied electric field at these points as discussed above, device operation can be degraded. In one embodiment, the herein described provision of a thick oxide layer along the top surface of the source-drain structure provides the device with a robust resistance to the breakdown of the bottom oxide at the top surface corners of the source-drain structure.

Scaling

Exemplary embodiments, enable scaling of memory cells to the sub 40 nm range because of the robustness of the resistance of the memory cells to breakdown as is discussed herein in detail.

Figure 5:
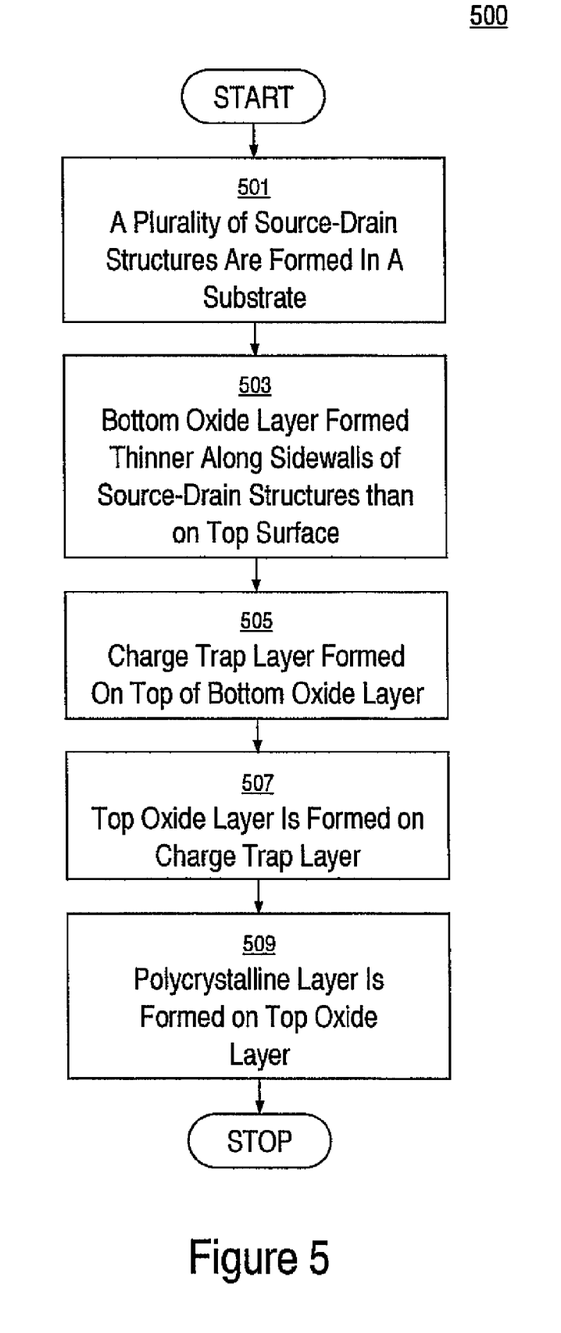
FIG. 5 shows a flowchart of the steps performed in a method for fabricating SONOS memory cells that have a non-uniform tunnel oxide layer according to one embodiment.

Method for Fabricating SONOS Memory Cells
Having Non-Uniform Tunnel Oxide According to
One Embodiment FIG. 5 shows a flowchart 500 of the steps performed in a method for fabricating SONOS memory cells that have a non-uniform tunnel oxide layer according to one embodiment. In one embodiment, the fabrication of the memory cells can be a part of a larger process for fabricating a memory cell array. Although specific steps are disclosed in the flowcharts, such steps are exemplary. That is the present invention is well suited to performing various other steps or variations of the steps recited in the flowcharts.

Referring to FIG. 5, at 501 a plurality of source-drain structures with rounded tops and edges are formed in a substrate wafer.

At 503, a bottom oxide layer is formed over the source-drain structures. In one embodiment, the bottom oxide (e.g., 417 in FIG. 4J) is formed to be more thick along the top surfaces of the source-drain structures than along sidewalls of the source-drain structures. In one embodiment, the bottom oxide is a tunnel oxide through which electrons are tunneled. Moreover, in one embodiment, the bottom oxide forms an interface with the source-drain structures.

At 505, a nitride charge trapping layer is formed over the bottom oxide layer. In one embodiment, the nitride charge trapping layer (e.g., 419 in FIG. 4N) forms the charge storing element of the completed memory cell structure. In one embodiment, the nitride charge trapping layer can include Si rich nitride.

At 507, a top oxide layer is formed over the nitride charge trapping layer. And, at 509, a polycrystalline silicon layer is formed over the top oxide layer.

With reference to exemplary embodiments thereof, methods for forming a memory cell are disclosed. A method includes forming a source-drain structure in a semiconductor substrate where the source-drain structure includes a rounded top surface and sidewall surfaces. An oxide layer is formed on the top and sidewall surfaces of the source-drain structure. The thickness of the portion of the oxide layer that is formed on the top surface of the source-drain structure is greater than the thickness of the portion of the oxide layer that is formed on the sidewall surfaces of the source-drain structure.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

We claim:

1. A memory cell, comprising:
   a source-drain structure in a semiconductor substrate wherein said source-drain structure includes a rounded top surface and sidewall surfaces;
   a first oxide layer formed on said top surface and said sidewall surfaces of said source-drain structure, wherein the thickness of a portion of said first oxide layer that is formed on said top surface of said source-drain structure is greater than the thickness of a portion of said first oxide layer that is formed on said sidewall surfaces of said source-drain structure and a conduction region of said source-drain structure is orthogonal to a direction from one sidewall surface of said source-drain structure to the other and comprises the area between said one sidewall surface of said source-drain structure and said other;
   a nitride charge storage layer formed on said first oxide layer;
   a second oxide layer formed on said charge storage layer; and
   a polysilicon layer formed on said second oxide layer.

2. The memory cell of claim 1 wherein said thickness of said portion of said first oxide layer formed on said top surface of said source-drain structure is at least 1.5 times the thickness of said portion of said first oxide layer formed on said side surfaces of said source-drain structure.

3. The memory cell of claim 1 wherein said memory cell is a less than 40 nm in width.

4. The memory cell of claim 1 wherein said nitride charge storage layer is a single continuous layer that is formed adjacent the top surface and respective sidrwall surfaces of said source-drain structure.

5. The memory cell of claim 1 wherein said nitride charge storage layer is separated into portions that are located adjacent respective sidewall surfaces of said source-drain structure.

6. The memory cell of claim 1 wherein said source-drain structure is associated with an individual charge storage cell.

* * * * *